(12) United States Patent
Ha

(10) Patent No.: US 11,439,027 B2
(45) Date of Patent: Sep. 6, 2022

(54) DISPLAY DEVICE AND METHOD FOR MANUFACTURING THE SAME HAVING IMPROVED FOLDING RELIABILITY

(71) Applicant: Samsung Display Co., Ltd., Yongin-Si (KR)

(72) Inventor: SeungHwa Ha, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 39 days.

(21) Appl. No.: 16/711,976

(22) Filed: Dec. 12, 2019

(65) Prior Publication Data

US 2020/0229312 A1 Jul. 16, 2020

(30) Foreign Application Priority Data

Jan. 16, 2019 (KR) .................. 10-2019-0005769

(51) Int. Cl.
*H05K 5/00* (2006.01)
*G06F 1/16* (2006.01)
*H05K 5/02* (2006.01)

(52) U.S. Cl.
CPC ......... *H05K 5/0017* (2013.01); *G06F 1/1652* (2013.01); *G06F 1/1681* (2013.01); *H05K 5/0217* (2013.01); *H05K 5/0226* (2013.01)

(58) Field of Classification Search
CPC ... G06F 1/1652; G06F 1/1681; H05K 5/0017; H05K 5/0217; H05K 5/0226; H04M 1/0268; G02F 1/133305
See application file for complete search history.

(56) References Cited

U.S. PATENT DOCUMENTS

| 9,204,565 | B1 | 12/2015 | Lee et al. | |
| 2017/0034906 | A1* | 2/2017 | Myung | ............... H05K 1/0281 |
| 2018/0150102 | A1 | 5/2018 | Lee et al. | |
| 2019/0036068 | A1 | 1/2019 | Kim et al. | |

FOREIGN PATENT DOCUMENTS

| EP | 2985671 A1 | 2/2016 |
| KR | 101834793 B1 | 3/2018 |

* cited by examiner

*Primary Examiner* — James Wu
(74) *Attorney, Agent, or Firm* — Cantor Colburn LLP

(57) ABSTRACT

A display device includes a display module on which a first non-folding area, a folding area, and a second non-folding area are sequentially defined in a first direction and which is deformable between a first state that is an unfolded sate and a second state that is a folded state and a sheet member including a first support portion overlapping the first non-folding area, a second support portion overlapping the second non-folding area, and a restoration portion overlapping the folding area, which are disposed below the display module. When the display module is in the first state, the restoration portion has an elastic force.

16 Claims, 15 Drawing Sheets

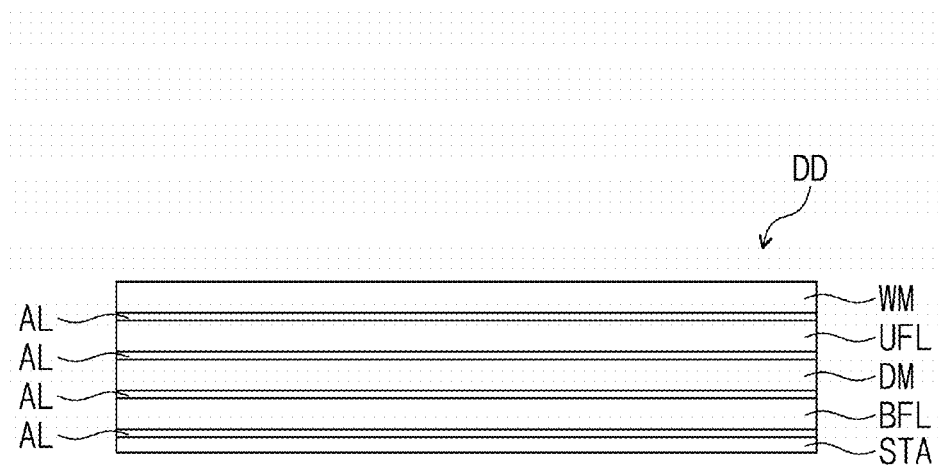

DISPLAY DEVICE AND METHOD FOR MANUFACTURING THE SAME HAVING IMPROVED FOLDING RELIABILITY

This application claims priority to Korean Patent Application No. 10-2019-0005769, filed on Jan. 16, 2019, and all the benefits accruing therefrom under 35 U.S.C. § 119, the content of which in its entirety is herein incorporated by reference.

BACKGROUND

1. Field

Exemplary embodiments of the invention herein relate to a display device having improved folding reliability and a method for manufacturing the display device.

2. Description of the Related Art

A display device displays various images on a display screen to provide information to a user. In general, the display device displays information within an assigned screen. In recent years, a flexible display device including a foldable flexible display panel is being developed. The flexible display device may be foldable or rollable, unlike a flat panel display device. The flexible display device that is capable of being changed in various shapes may be portable regardless of a size of an existing screen to improve user's convenience.

SUMMARY

Stress may occur in a flexible display device due to repeated folding operations. The stress may cause permanent deformation of the flexible display device.

Exemplary embodiments provide a display device having improved folding reliability and a method for manufacturing the display device.

An exemplary embodiment of the invention provides a display device including a display module on which a first non-folding area, a folding area, and a second non-folding area are sequentially defined in a first direction and which is deformable between a first state that is an unfolded sate and a second state that is a folded state, and a sheet member including a first support portion overlapping the first non-folding area, a second support portion overlapping the second non-folding area, and a restoration portion overlapping the folding area, which are disposed below the display module, where, when the display module is in the first state, the restoration portion has an elastic force.

In an exemplary embodiment, the restoration portion may be connected between the first support portion and the second support portion, and a first area of the restoration portion, which is adjacent to the first support portion, and a second area of the restoration portion, which is adjacent to the second support portion, may be bent.

In an exemplary embodiment, an area between the first area and the second area of the restoration portion may have a curvature.

In an exemplary embodiment, the restoration portion may include a bent area defined between the first area and the second area, and the bent area may be an area on which the restoration portion is bent.

In an exemplary embodiment, the restoration portion may protrude from the first support portion and the second support portion in a direction that is away from the display module.

In an exemplary embodiment, the restoration portion may protrude from the first support portion and the second support portion toward the display module.

In an exemplary embodiment, the first support portion, the restoration portion, and the second support portion may be unitary with each other.

In an exemplary embodiment, the restoration portion may include a first restoration portion connected to the first support portion and bent from the first support portion and a second restoration portion connected to the second support portion and bent from the second support portion, and the first restoration portion and the second restoration portion may be coupled to each other.

In an exemplary embodiment, the sheet member may further include a first elastic member attached to the first area, and a second elastic member attached to the second area.

In an exemplary embodiment, the restoration portion may be provided in plural, and the plurality of restoration portions may be connected between the first support portion and the second support portion.

In an exemplary embodiment, each of the first support portion and the second support portion may extend toward an area overlapping the folding area so as to be unitary with each other, and the restoration portion may be attached to a rear surface of the first support portion overlapping the folding area and a rear surface of the second support portion overlapping the folding area.

In an exemplary embodiment, each of the first support portion, the second support portion, and the restoration portion may include invar, stainless steel, an amorphous metal, a copper alloy, or a clad metal.

In an exemplary embodiment, when changed from the first state into the second state, the second non-folding area may rotate in a first rotation direction with respect to the first non-folding area, and a direction of the elastic force may be opposite to the first rotation direction.

In an exemplary embodiment, the display device may further include a step compensation layer disposed between the display module and the sheet member, where the step compensation layer may overlap the first non-folding area, the folding area, and the second non-folding area.

In an exemplary embodiment, the step compensation layer may include a resin or a metal.

In an exemplary embodiment of the invention, a method for manufacturing a display device includes forming a display module on which a first display area and a second display area are defined, forming a sheet member including a first support portion, a second support portion, and a restoration portion connected to the first support portion and the second support portion, where an angle between the first support portion and the second support portion is less than about 180 degrees, and coupling the display module to the sheet member.

In an exemplary embodiment, the display module may be in-folded so that the first display area and the second display area face each other, and the angle may be defined between a bottom surface of the first support portion and a bottom surface of the second support portion.

In an exemplary embodiment, the display module may be out-folded so that the first display area and the second display area are opposite to each other, and the angle may be an angle between a top surface of the first support portion and a top surface of the second support portion.

In an exemplary embodiment, the forming the sheet member may include bending an area between the first support portion and the second support portion to form a restoration portion.

In an exemplary embodiment, the forming the sheet member may include attaching a first elastic member between the first support portion and the restoration portion, and attaching a second elastic member between the second support portion and the restoration portion.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings:

FIG. 4 is a schematic cross-sectional view illustrating an exemplary embodiment of a portion of constituents of the display device according to the invention;

DETAILED DESCRIPTION

Figure 1:
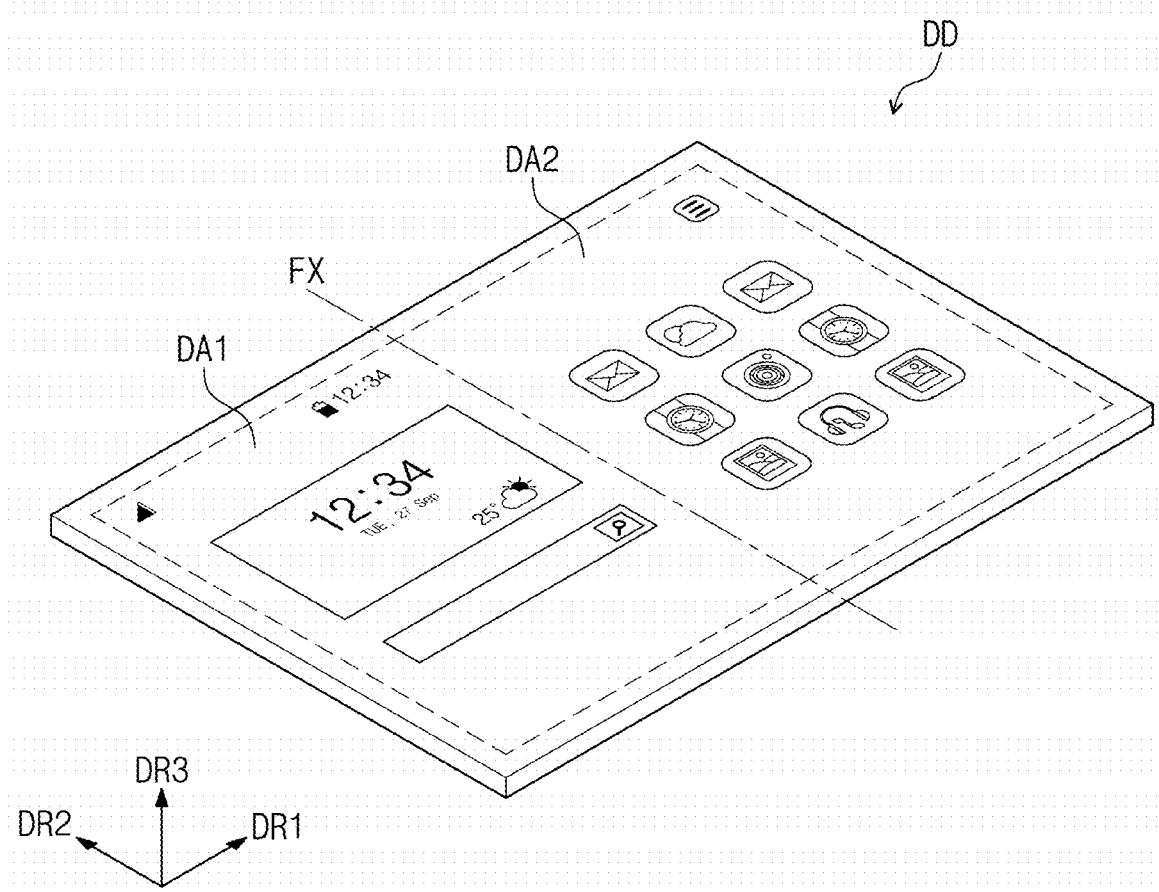
FIG. 1 is a perspective view of an exemplary embodiment of a display device according to the invention.

In this specification, it will also be understood that when one component (or region, layer, portion) is referred to as being 'on', 'connected to', or 'coupled to' another component, it may be directly disposed/connected/coupled on/to the one component, or an intervening third component may also be present.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. In an exemplary embodiment, a first element referred to as a first element in one embodiment may be referred to as a second element in another exemplary embodiment without departing from the scope of the appended claims. The terms of a singular form may include plural forms unless referred to the contrary.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of 'include' or 'comprise' specifies a property, a fixed number, a step, an operation, an element, a component or a combination thereof, but does not exclude other properties, fixed numbers, steps, operations, elements, components or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the accompanying drawings.

FIG. 1 is a perspective view of an exemplary embodiment of a display device according to the invention.

FIG. 1 is a perspective view of an exemplary embodiment of a display device DD according to the invention. The display device DD according to the invention may be used for large-sized electronic devices such as televisions and monitors and small and middle-sized electronic devices such as mobile phones, tablet personal computer ("PC"), navigation units for vehicles, game consoles, and smart watches.

The display device DD may be folded with respect to a folding axis FX extending in a second direction DR2 crossing a first direction DR1. That is, the display device DD may be referred to as a foldable display device.

The display device DD may display an image through first and second display areas DA1 and DA2. In FIG. 1, a watch window and application icons are illustrated as an example of the image. A left display area with respect to the folding axis FX may be referred to as a first display area DA1, a right display area with respect to the folding axis FX may be referred to as a second display area DA2. The first display area DA1 and the second display area DA2 may be adjacent to each other in the first direction DR1.

FIG. 1 illustrates an example in which the folding axis FX passes through a center of the display device DD to extend in the second direction DR2. Also, FIG. 1 illustrates an example in which the first display area DA1 and the second display area DA2 have the same surface area. However, the invention is not limited thereto. Even though the folding axis FX passes through the center of the display device DD to extend in the second direction DR2 in the illustrated exemplary embodiment, the first display area DA1 and the second display area DA2 may have surface areas different from each other in another exemplary embodiment. Also, the folding axis FX may be biased in one direction in another exemplary embodiment. In this case, the first display area DA1 and the second display area DA2 may have surface areas different from each other.

A state in which the display device DD is not folded, i.e., an unfolded state, may be referred to as a first state. In an exemplary embodiment, the unfolded state may be a flat state, for example. In this case, each of the first display area DA1 and the second display area DA2 of the display device DD may be parallel to a surface defined in the first direction DR1 and the second direction DR2.

In this exemplary embodiment, when the display device DD is in the first state, a front surface (or a top surface) or a rear surface (or a bottom surface) of each of members may be defined with respect to a direction in which an image is displayed. The front and rear surfaces may face each other in a third direction DR3. A normal direction of each of the front and rear surfaces may be parallel to the third direction DR3. The directions indicated as the first to third directions DR1, DR2, and DR3 may be a relative concept and thus changed into different directions. Hereinafter, the first to third directions may be directions indicated by the first to third directions DR1, DR2, and DR3 and designated by the same reference numerals, respectively.

Figure 2:
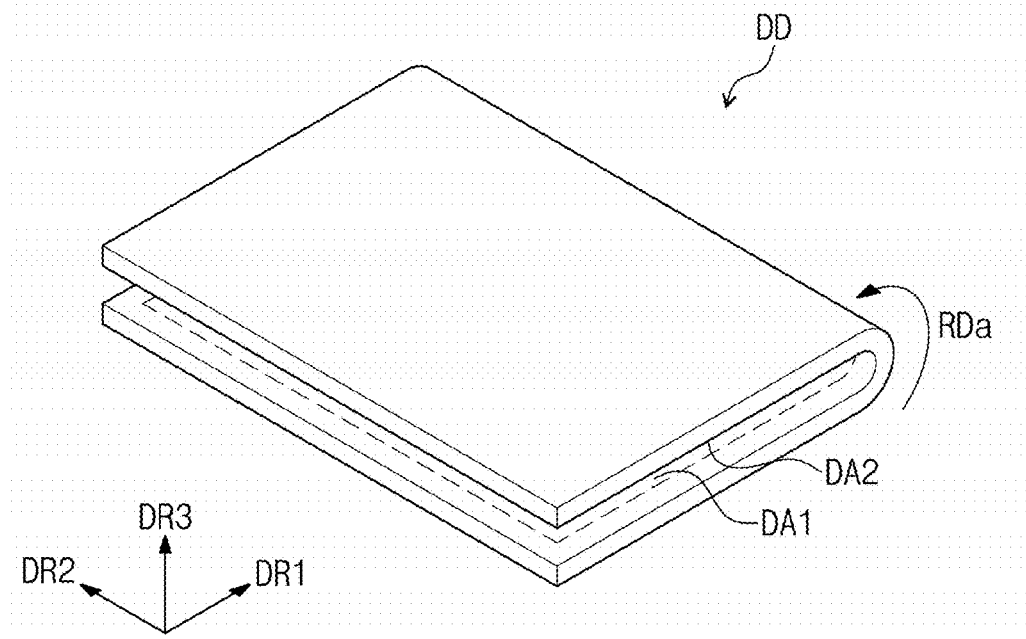
FIG. 2 is a perspective view of an exemplary embodiment of the display device according to the invention.

FIG. 2 is a perspective view of another exemplary embodiment of the display device according to the invention.

Referring to FIGS. 1 and 2, the display device DD may be in-folded with respect to the folding axis FX. FIG. 2 illustrates the in-folded display device DD. As illustrated in FIG. 2, a state in which the display device DD is completely folded may be referred to as a second state.

The in-folded state may be a state in which the first display area DA1 and the second display area DA2 are folded to face each other. Thus, in the state in which the display device DD is completely folded, the first display area DA1 and the second display area DA2 may not be seen from the outside.

When the display device DD is changed from the unfolded first state into the in-folded second state, a portion of the display device DD including the second display area DA2 may rotate with respect to the other portion of the display device DD including the first display area DA1 in a first rotation direction RDa.

Figure 3:
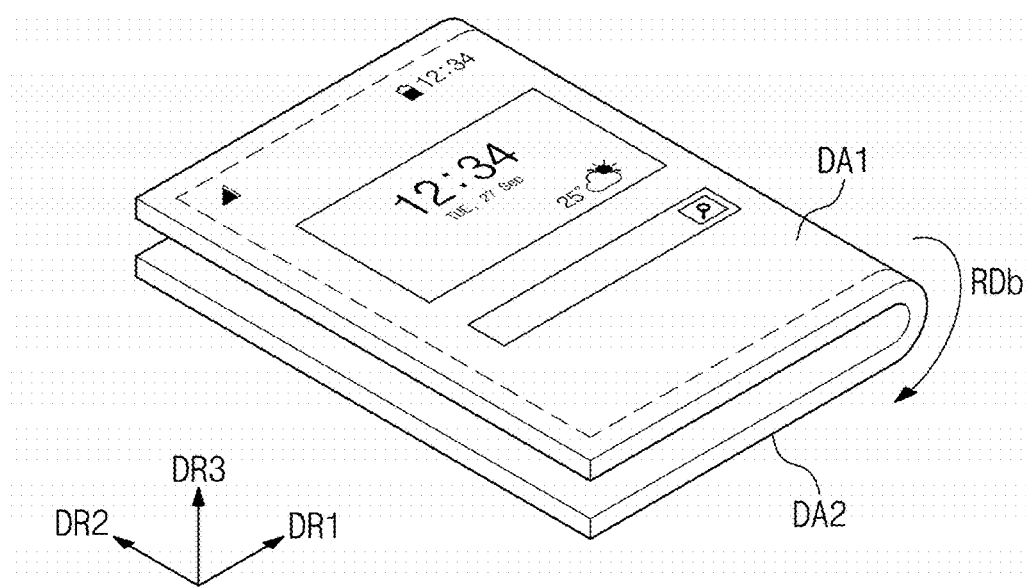
FIG. 3 is a perspective view of an exemplary embodiment of the display device according to the invention.

FIG. 3 is a perspective view of an exemplary embodiment of the display device according to the invention.

Referring to FIGS. 1 and 3, the display device DD may be out-folded with respect to the folding axis FX. FIG. 3 illustrates the out-folded display device DD. As illustrated in FIG. 3, a state in which the display device DD is completely folded may be referred to as a second state.

The out-folded state may be a state in which the first display area DA1 and the second display area DA2 are folded so as not to face each other. Thus, even in the state in which the display device DD is completely folded, the first display area DA1 and the second display area DA2 may be seen from the outside.

When the display device DD is changed from the unfolded first state into the out-folded second state, a portion of the display device DD including the second display area DA2 may rotate with respect to the other portion of the display device DD including the first display area DA1 in a second rotation direction RDb. The second rotation direction RDb may be an opposite direction to the first rotation direction RDa that is described in FIG. 2.

FIG. 4 is a schematic cross-sectional view illustrating an exemplary embodiment of a portion of constituents of the display device according to the invention. FIG. 4 briefly illustrates a portion of constituents provided in the display device DD.

Referring to FIG. 4, the display device DD may include a window WM, an upper functional layer UFL, a display module DM, a lower functional layer BFL, and a sheet member STA.

The window WM may include an optically transparent insulation material. In an exemplary embodiment, the window WM may include glass or plastic, for example. The window WM may have a single layer or multilayered structure. In an exemplary embodiment, the window WM may include a plurality of plastic films bonded to each other by an adhesive or include a glass substrate and a plastic film, which are bonded to each other by an adhesive, for example.

The upper functional layer UFL may include an antireflection layer. The antireflection layer may reduce reflectivity of external light incident from the outside. In an exemplary embodiment, the antireflection layer may include a polarizer, for example. However, this is merely an example. In an exemplary embodiment, the upper functional layer UFL may include an anti-fingerprint layer, an anti-glare layer, and a hard coating layer, for example. Also, in other exemplary embodiments, a portion of the upper functional layer UFL may be disposed on the window WM, and a portion of the upper functional layer UFL may be disposed within the display module DM or be omitted.

The display module DM may be disposed below the upper functional layer UFL. The display module DM may include a display panel and an input sensing unit. The display panel may substantially generate an image, and the input sensing unit may sense an external input applied from the outside.

The lower functional layer BFL may be disposed below the display module DM. The lower functional layer BFL may include at least one of an impact-absorbing functional layer, a light-blocking functional layer which blocks light, a heat-dissipating functional layer which dissipates heat, and an EMI shielding layer which blocks electromagnetic noise. The impact-absorbing functional layer may be referred to as a cushion layer.

The sheet member STA may be disposed below the lower functional layer BFL. The sheet member STA may be disposed below the display module DM to prevent the display module DM from being permanently deformed. However, the invention is not limited thereto, and in another exemplary embodiment of the invention, the lower functional layer BFL may be omitted. In this case, the sheet member STA may be coupled to the display module DM. The sheet member STA will be described below in detail.

The window WM, the upper functional layer UFL, the display module DM, the lower functional layer BFL, and the sheet member STA may be coupled to each other through an adhesion member AL. In an exemplary embodiment, the adhesion member may be an optical clear adhesive ("OCA"), for example. Although the adhesion member AL is disposed between the window WM and the upper functional layer UFL, between the upper functional layer UFL and the display module DM, between the display module DM and the lower functional layer BFL, and between the lower functional member BFL and the sheet member STA in FIG. 4, the invention is not limited thereto. In an exemplary embodiment, in an exemplary embodiment of the invention, at least partial constituents of the window WM, the upper functional layer UFL, the display module DM, the lower functional layer BFL, and the sheet member STA may be provided through a continuous process, for example. When the above-described constituents are provided through the continuous process, the adhesion member AL may be omitted. The partial constituents may be provided through the continuous process, and the partial constituents may be coupled to each other through the adhesion member.

Figure 5A:
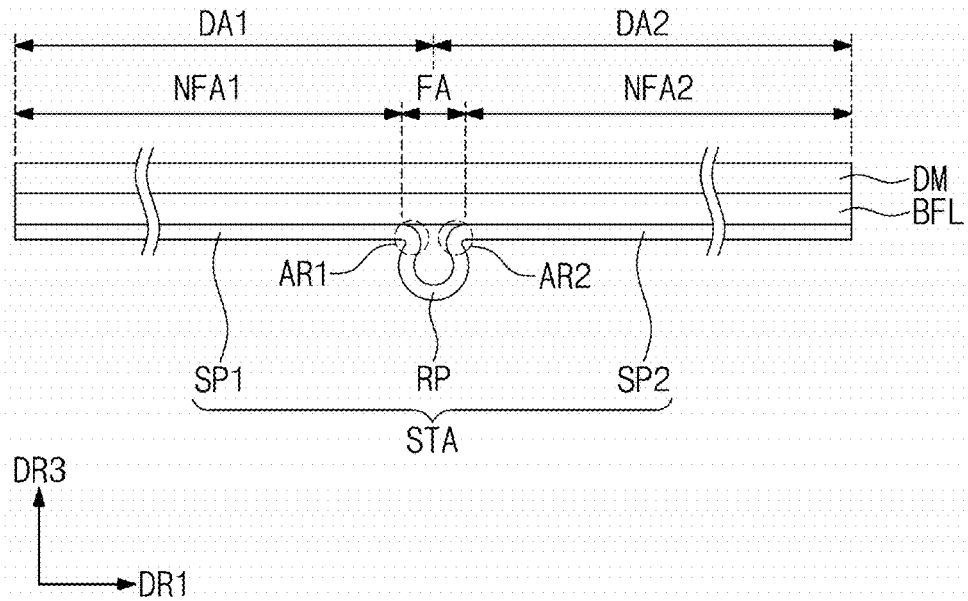
FIG. 5A is a cross-sectional view illustrating an exemplary embodiment of a portion of the constituents of the display device according to the invention.

FIG. 5A is a cross-sectional view illustrating an exemplary embodiment of a portion of the constituents of the display device according to the invention.

FIG. 5A illustrates the display module DM, the lower functional layer BFL, and the sheet member STA. Although not shown, the adhesion member may be disposed between the display module DM and the lower functional layer BFL and between the lower functional layer BFL and the sheet member STA. The adhesion member may include a common adhesive or an adhesive agent.

A first non-folding area NFA1, a folding area FA, and a second non-folding area NFA2 may be sequentially defined on the display module DM in the first direction DR1.

When the display device DD (refer to FIG. 1) is changed from the unfolded first state into the in-folded second state, or the display device DD is changed from the unfolded first state into the out-folded second state, the bent area may be defined as a folding area FA, and the unfolded area may be defined as a first non-folding area NFA1 and a second non-folding area NF2. The first non-folding area NFA1 and the second non-folding area NFA2 may be spaced apart from each other with the folding area FA therebetween.

The first display area DA1 of the display device DD (refer to FIG. 1) may correspond to the first display area DA1 of the display module DM, and the second display area DA2 of the display device DD may correspond to the second display area DA2 of the display module DM.

In a plan view, the first display area DA1 may include the first non-folding area NFA1 and a portion of the folding area FA, and the second display area DA2 may include the second non-folding area NFA2 and the other portion of the folding area FA.

The sheet member STA may include a first support portion SP1, a second support portion SP2, and a restoration portion RP. The restoration portion RP may be connected between the first support portion SP1 and the second support portion SP2. The restoration portion RP may protrude from the first support portion SP1 and the second support portion SP2 in a direction (e.g., lower direction in FIG. 5A) that is away from the display module DM.

The restoration portion RP may include a first area AR1 and a second area AR2. Each of the first area AR1 and the second area AR2 may have a bent shape. The first area AR1 may be adjacent to the first support portion SP1, and the second area AR2 may be adjacent to the second support portion SP2. An area between the first area AR1 and the second area AR2 may have a curvature. The restoration portion RP may have an elastic force by the first area AR1, the second area AR2, and the curvature. This will be described with reference to FIGS. 5B and 5C.

In an exemplary embodiment of the invention, the first support portion SP1, the restoration portion RP, and the second support portion SP2 may be connected to each other to provide one body. That is, the first support portion SP1, the restoration portion RP, and the second support portion SP2 may be divided according to the position of the sheet member STA having one body. In an exemplary embodiment, in a plan view, the first support portion SP1 may overlap the first non-folding area NFA1, the second support portion SP2 may overlap the second non-folding area NFA2, and the restoration portion RP may overlap the folding area FA, for example. That is, the first support portion SP1 may support the first display area DA1, and the second support portion SP2 may support the second display area DA2.

The sheet member STA may include a material having elasticity. The sheet member STA may include a metal or a metal alloy. In an exemplary embodiment, the sheet member STA may include invar, stainless steel, an amorphous metal, a copper alloy, or a clad metal, for example. In an exemplary embodiment, the stainless steel may be SUS304 or SUS301, for example. The clad metal may be stainless steel, aluminum, and a method bonded with stainless steel. In an exemplary embodiment, the clad metal may have a structure in which aluminum is disposed between two stainless steels, for example.

The sheet member STA may have a thickness that varies according to a minimum curvature radius of the folding area FA. When the curvature radius decreases, the thickness of the sheet member STA may decrease. In an exemplary embodiment, when the minimum curvature radius is about 3 millimeters (mm), the sheet member STA may have a thickness of about 10 micrometers ($\mu$m) to about 30 $\mu$m, for example.

Figure 5B:
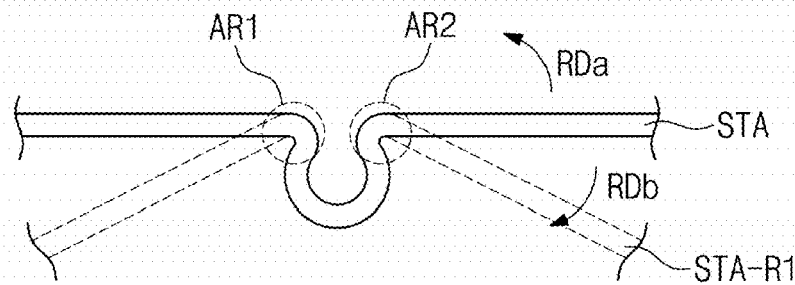
FIG. 5B is a cross-sectional view of an exemplary embodiment of a sheet member according to the invention.

FIG. 5B is a cross-sectional view of an exemplary embodiment of the sheet member according to the invention. Hereinafter, this will be described with reference to FIGS. 2, 5A, and 5B.

FIG. 5B illustrates the sheet member STA provided in the in-foldable display device DD. The sheet member STA may have an elastic force by the first area AR1 and the second area AR2.

A sheet member STA illustrated as a solid line may be a sheet member STA attached to the display module DM that is in the unfolded state, e.g., in the flat sate. A sheet member STA-R1 illustrated as a dotted line may be a sheet member before the sheet member STA is attached to the display module DM. In FIG. 5B, the sheet member STA that is illustrated as the solid line may be referred to as a first sheet member STA, and the sheet member STA-R1 that is illustrated as the dotted line may be referred to as a second sheet member STA-R1 for convenience of description.

The first sheet member STA may have an elastic force to return to the shape of the second sheet member STA-R1. In an exemplary embodiment, when the display device DD is in-folded, the first sheet member STA may be deformed in the first rotation direction RDa, for example. The elastic force of the first sheet member STA may be applied in a second rotation direction RDb opposite to the first rotation direction RDa.

In detail, a case in which the display device DD is in-folded in a state in which the positions of the first non-folding area NFA1 and the first support portion SP1 are fixed will be described as an example. In this case, the second non-folding area NFA2 may rotate in the first rotation direction RDa with respect to the first non-folding area NFA1, and the direction of the elastic force of the first sheet member STA may be the second rotation direction RDb opposite to the first rotation direction RDa.

When the display module DM is in the unfolded state, i.e., the first state, the first support portion SP1 and the second support portion SP2 may be disposed on the same plane. In the first state, the first sheet member STA may be in the same state as that in which the second sheet member STA-R1 that is bent at a predetermined angle is deformed by external force. In the first state, the first sheet member STA may have an elastic force to return to the shape of the second sheet member STA-R1.

When the display device DD is repeatedly folded, stress exceeding yield strength, e.g., tensile stress may be applied to the display module DM. Thus, the display module DM may be permanently deformed to deteriorate folding reliability. Particularly, possibility of the permanent deformation may be high in the folding area. According to the invention, the stress may be prevented from being concentrated to a specific area of the display module DM by the first sheet member STA. In an exemplary embodiment, compressive stress may be applied to the display module DM by the first sheet member STA, for example. That is, the tensile stress applied to the display module DM may be offset by the compressive stress generated by the first sheet member STA. Thus, the permanent deformation of the display module DM may be prevented to improve the folding reliability of the display device DD.

Figure 5C:
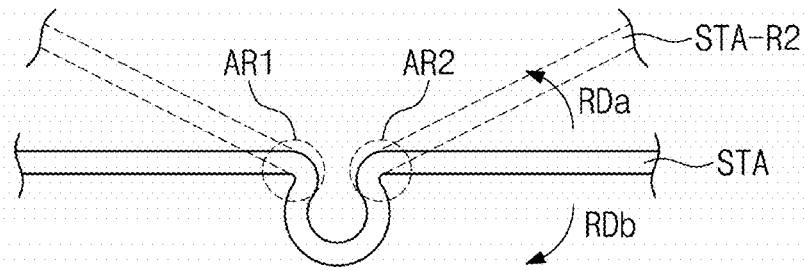
FIG. 5C is a cross-sectional view of an exemplary embodiment of a sheet member according to the invention.

FIG. 5C is a cross-sectional view of an exemplary embodiment of a sheet member according to the invention. Hereinafter, this will be described with reference to FIGS. 3, 5A, and 5C.

FIG. 5C illustrates a sheet member STA provided in the out-foldable display device DD. The sheet member STA may have an elastic force by the first area AR1 and the second area AR2.

A sheet member STA illustrated as a solid line may be a sheet member STA attached to the display module DM that is in the unfolded state, e.g., in the flat sate. A sheet member STA-R2 illustrated as a dotted line may be a sheet member before the sheet member STA is attached to the display module DM.

A case in which the display device DD is in-folded in a state in which the positions of the first non-folding area NFA1 and the first support portion SP1 are fixed will be described as an example. In this case, the second non-folding area NFA2 may rotate in the second rotation direction RDb with respect to the first non-folding area NFA1, and the direction of the elastic force of the sheet member STA may be the direction RDa opposite to the second rotation direction RDb.

According to the invention, stress opposite to the stress applied to the display module DM may be applied by the sheet member STA. That is, even though the display device DD is repeatedly folded, the stress applied to the display module DM may be offset by the sheet member STA to prevent the display module DM from being permanently deformed.

Figure 6:
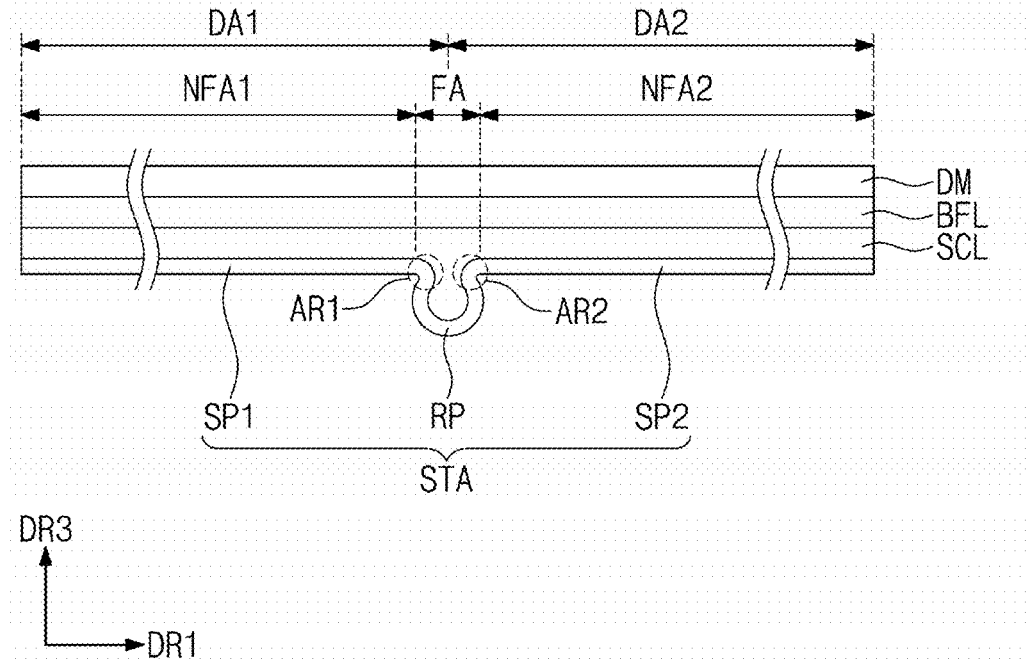
FIG. 6 is a cross-sectional view illustrating an exemplary embodiment of a portion of the constituents of the display device according to the invention.

FIG. 6 is a cross-sectional view illustrating an exemplary embodiment of a portion of the constituents of the display device according to the invention.

Referring to FIG. 6, a step compensation layer SCL may be further disposed between the display module DM and the sheet member STA. When the lower functional layer BFL is disposed below the display module DM, the step compensation layer SCL may be disposed between the lower functional layer BFL and the sheet member STA.

The step compensation layer SCL may overlap the first non-folding area NFA1, the folding area FA, and the second non-folding area NFA2. In an exemplary embodiment of the invention, the step compensation layer SCL may include a resin. The step compensation layer SCL may be filled into a space defined by the restoration portion RP.

The step compensation layer SCL may cover a stepped portion of the sheet member STA, which is generated by the restoration portion RP. Thus, a top surface of the step compensation layer SCL may have a flat surface. The top surface may be a surface facing the display module DM.

Figure 7:
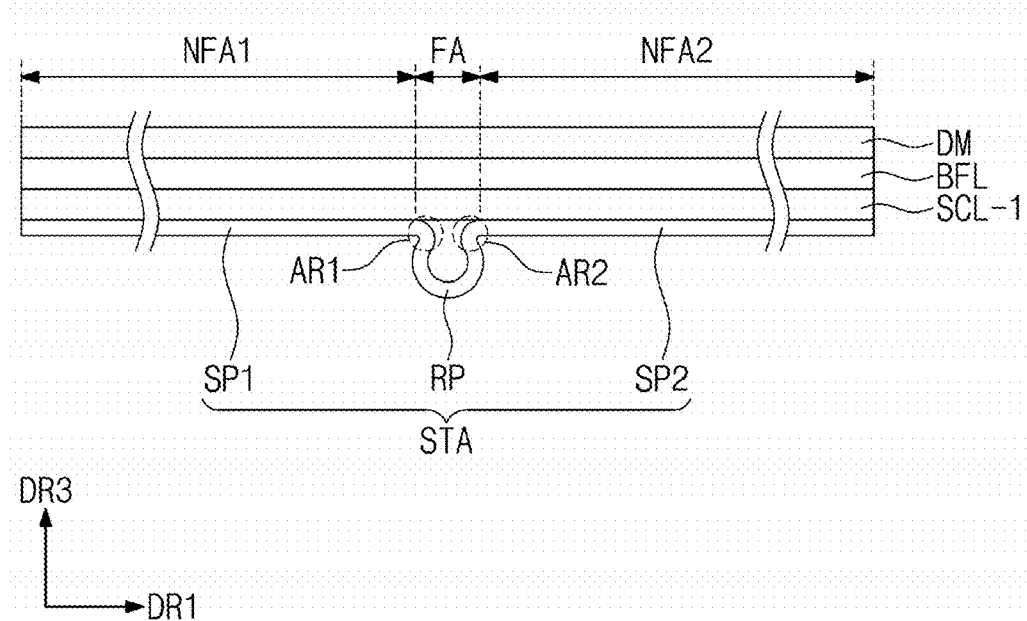
FIG. 7 is a cross-sectional view illustrating an exemplary embodiment of a portion of the constituents of the display device according to the invention.

FIG. 7 is a cross-sectional view illustrating an exemplary embodiment of a portion of the constituents of the display device according to the invention.

Referring to FIG. 7, a step compensation layer SCL-1 may be further disposed between the display module DM and the sheet member STA. The step compensation layer SCL-1 may include a metal. In an exemplary embodiment, the step compensation layer SCL-1 may be a metal sheet, for example. The step compensation layer SCL-1 may cover a curve provided on the restoration portion RP.

Figure 8:
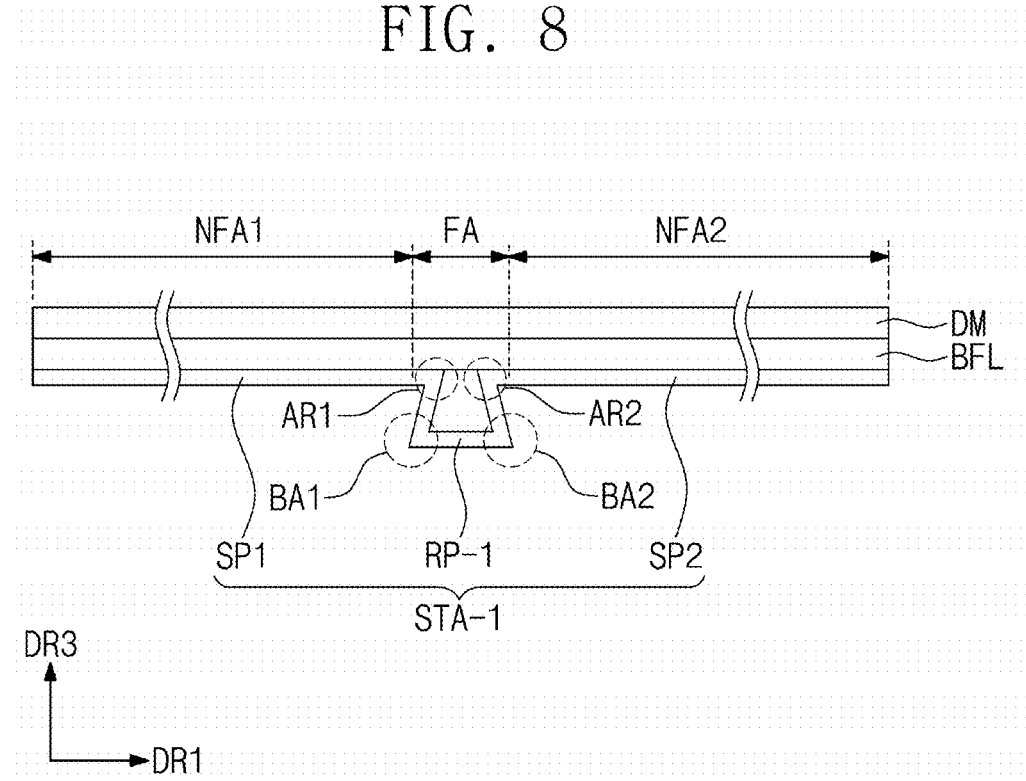
FIG. 8 is a cross-sectional view illustrating an exemplary embodiment of a portion of the constituents of the display device according to the invention.

FIG. 8 is a cross-sectional view illustrating an exemplary embodiment of a portion of the constituents of the display device according to the invention.

Referring to FIG. 8, a sheet member STA-1 may include a first support portion SP1, a second support portion SP2, and a restoration portion RP-1.

The restoration portion RP-1 may include a first area AR1 and a second area AR2, and each of the first area AR1 and the second area AR2 may have a bent shape. Also, the restoration portion RP-1 may further include at least one or more bent areas BA1 and BA2 defined between the first area AR1 and the second area AR2. Although the two bent areas BA1 and BA2 are exemplarily illustrated in FIG. 8, only one bent area may be provided, or three or more bent areas may be provided in other exemplary embodiments.

Figure 9:
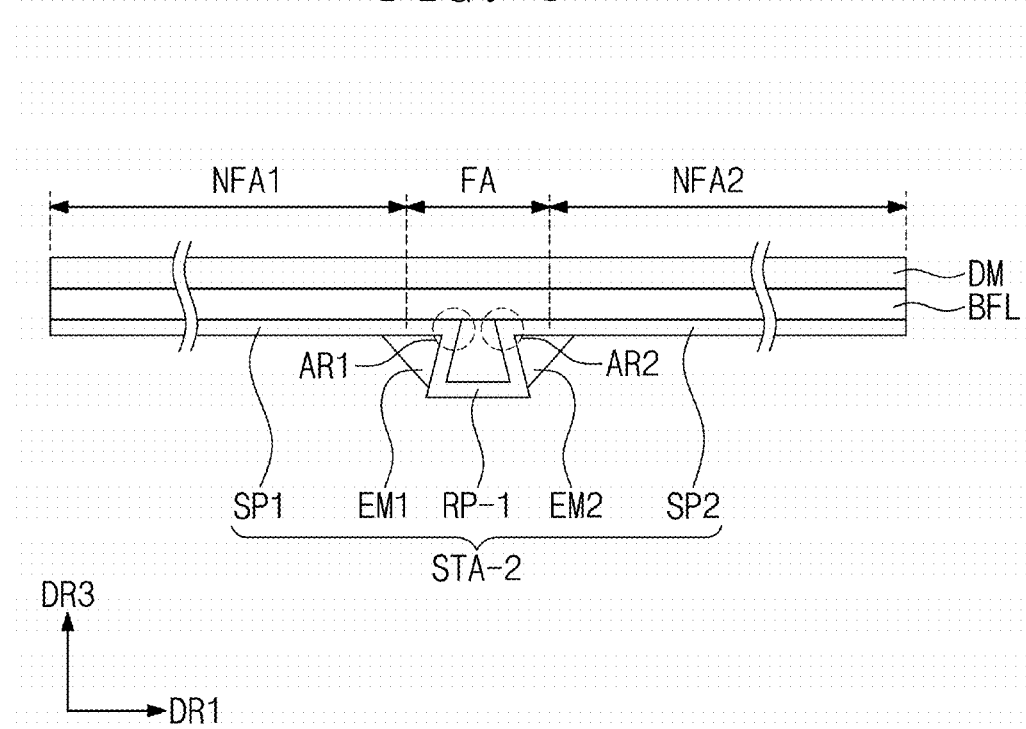
FIG. 9 is a cross-sectional view illustrating an exemplary embodiment of a portion of the constituents of the display device according to the invention.

FIG. 9 is a cross-sectional view illustrating an exemplary embodiment of a portion of the constituents of the display device according to the invention.

Referring to FIG. 9, a sheet member STA-2 may include a first support portion SP1, a second support portion SP2, a restoration portion RP-1, a first elastic member EM1, and a second elastic member EM2.

The first elastic member EM1 and the second elastic member EM2 may be attached to the restoration portion RP-1. In an exemplary embodiment, the first elastic member EM1 and the second elastic member EM2 may be attached to a rear surface of the restoration portion RP-1, for example. The first elastic member Em1 may be attached to the first area AR1, and the second elastic member EM2 may be attached to the second area AR2.

Each of the first elastic member EM1 and the second elastic member EM2 may include a material having elasticity. In an exemplary embodiment, each of the first elastic member EM1 and the second elastic member EM2 may be selected from materials having a recovery characteristic of about 95% or more, for example. In an exemplary embodiment, each of the first elastic member EM1 and the second elastic member EM2 may include a rubber or pressure sensitive adhesive ("PSV"), but the exemplary embodiment of the invention is not limited to the above-described material, for example. The recovery characteristic may mean a degree of returning to its original state when external force is applied and then removed.

Figure 10:
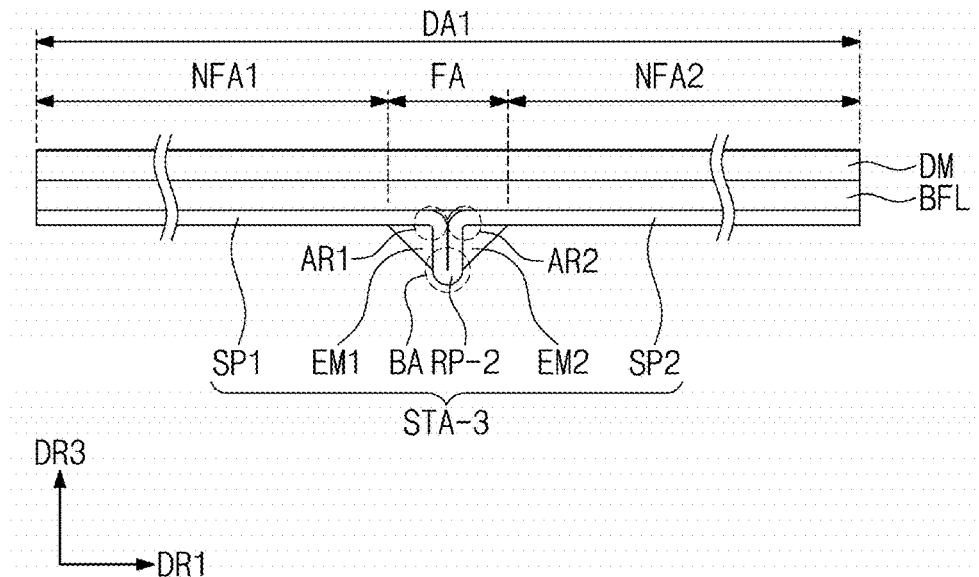
FIG. 10 is a cross-sectional view illustrating an exemplary embodiment of a portion of the constituents of the display device according to the invention.

FIG. 10 is a cross-sectional view illustrating an exemplary embodiment of a portion of the constituents of the display device according to the invention.

Referring to FIG. 10, a sheet member STA-3 may include a first support portion SP1, a second support portion SP2, a restoration portion RP-2, a first elastic member EM1, and a second elastic member EM2.

The restoration portion PR-2 may include a first area AR1 that is bent on an area adjacent to the first support portion SP1, a second area AR2 that is bent on an area adjacent to the second support portion SP2, and one bent area BA that is folded between the first area AR1 and the second area AR2.

Figure 11:
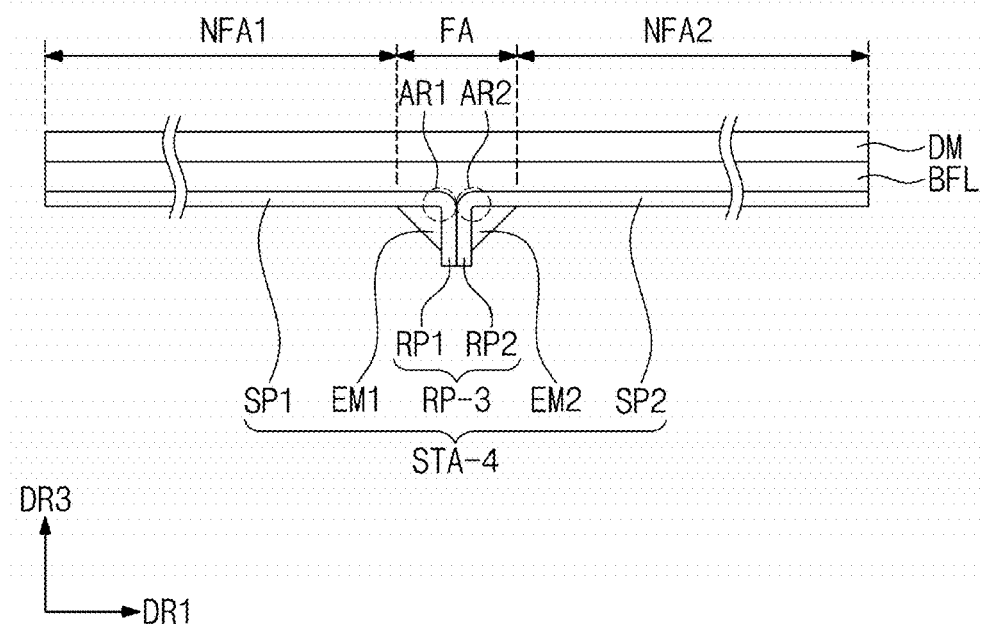
FIG. 11 is a cross-sectional view illustrating an exemplary embodiment of a portion of the display device according to the invention.

FIG. 11 is a cross-sectional view illustrating an exemplary embodiment of a portion of the constituents of the display device according to the invention.

Referring to FIG. 11, a sheet member STA-4 may include a first support portion SP1, a second support portion SP2, a restoration portion RP-3, a first elastic member EM1, and a second elastic member EM2.

The restoration portion RP-3 may include a first restoration portion RP1 and a second restoration portion RP2. The first restoration portion RP1 may be connected to the first support portion SP1 and be bent from the first support portion SP1. The second restoration portion RP2 may be connected to the second support portion SP2 and be bent from the second support portion SP2.

The first restoration portion RP1 and the second restoration portion RP2 may be coupled to each other. In an exemplary embodiment, the first restoration portion RP1 and the second restoration portion RP2 may be coupled to each other through welding, for example. However, this is merely an example. In an exemplary embodiment, the first restoration portion RP1 and the second restoration portion RP2 may be directly coupled to each other or be coupled to each other by an adhesion member (not shown), for example. The coupling member may be a material having an adhesive property.

Figure 12:
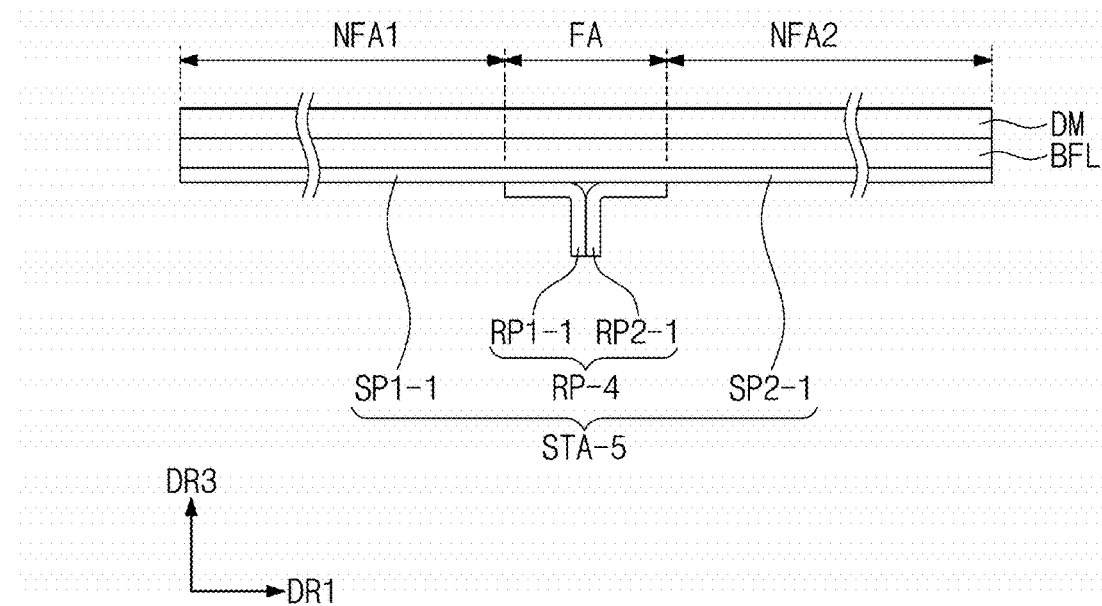
FIG. 12 is a cross-sectional view illustrating an exemplary embodiment of a portion of the constituents of the display device according to the invention.

FIG. 12 is a cross-sectional view illustrating an exemplary embodiment of a portion of the constituents of the display device according to invention.

Referring to FIG. 12, a sheet member STA-5 may include a first support portion SP1-1, a second support portion SP2-1, and a restoration portion RP-4.

The first support portion SP1-1 and the second support portion SP2-1 may extend toward an area overlapping the folding area FA to provide one body. That is, in the single sheet, a portion disposed below the first non-folding area NFA1 may be referred to the first support portion SP1-1, and a portion disposed below the second non-folding area NFA2 may be referred to the second support portion SP2-1.

The restoration portion RP-4 may be attached to a rear surface of the first support portion SP1-1 overlapping the folding area FA and a rear surface of the second support portion SP2-1 overlapping the folding area FA. The restoration portion RP-4 may include a first restoration portion RP1-1 and a second restoration portion RP-2. The first restoration portion RP1-1 may be attached to a rear surface of the first support portion SP1-1, and the second restoration portion RP2-1 may be attached to a rear surface of the second support portion SP2-1.

Figure 13:
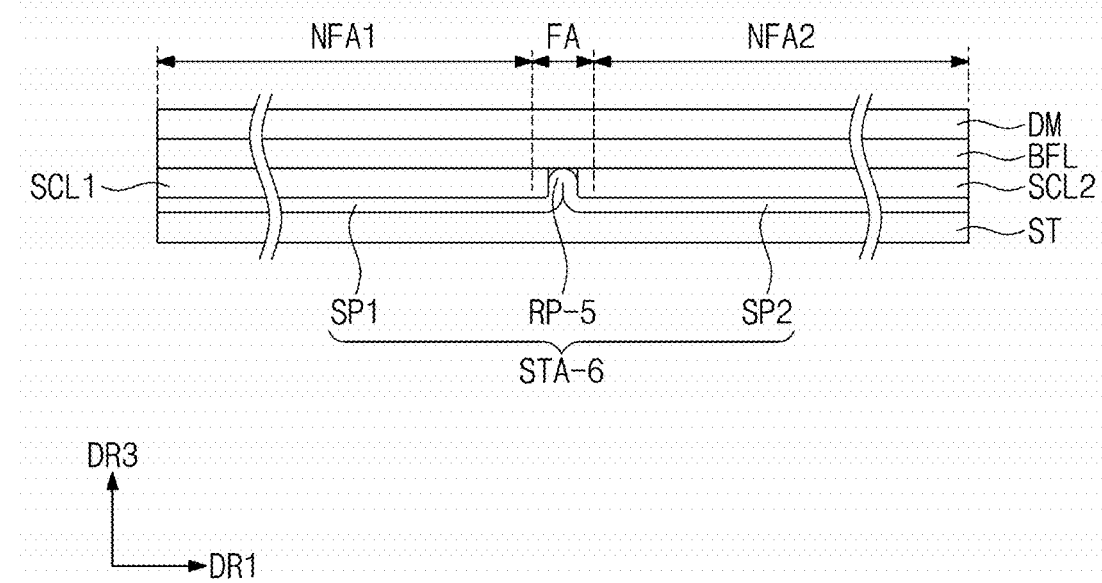
FIG. 13 is a cross-sectional view illustrating an exemplary embodiment of a portion of the constituents of the display device according to the invention.

FIG. 13 is a cross-sectional view illustrating an exemplary embodiment of a portion of the constituents of the display device according to the invention.

Referring to FIG. 13, a sheet member STA-6 may include a first support portion SP1, a second support portion SP2, and a restoration portion RP-5. A cover member ST may be further disposed on the rear surface of the sheet member STA-6. However, the invention is not limited thereto, and in another exemplary embodiment of the invention, the cover member ST may be omitted.

The restoration portion RP-5 may protrude from the first support portion SP1 and the second support portion SP2 in a direction of the display module DM.

A first step compensation layer SCL1 may be disposed between the first support portion SP1 and the display module DM, and a second step compensation layer SCL2 may be disposed between the second support portion SP2 and the display module DM. Each of the first step compensation layer SCL1 and the second step compensation layer SCL2 may have a thickness greater than a maximum height of the restoration portion RP-5 protruding from the first support portion SP1 or the second support portion SP2.

Although the restoration portion RP-5 of the sheet member STA-6 having the shape similar to that of FIG. 10 protrudes toward the display module DM in FIG. 13, the invention is not limited thereto. In an exemplary embodiment, a restoration portion of a sheet member having a shape similar to that of one of the restoration portions RP, RP-1, RP-2, RP-3, and RP-4 of the sheet members STA, STA-1, STA-3, STA-4, and STA-5 illustrated in FIGS. 6, 8, 10, 11, and 12 may protrude toward the display module DM and then be coupled to the display module DM, for example.

Figure 14:
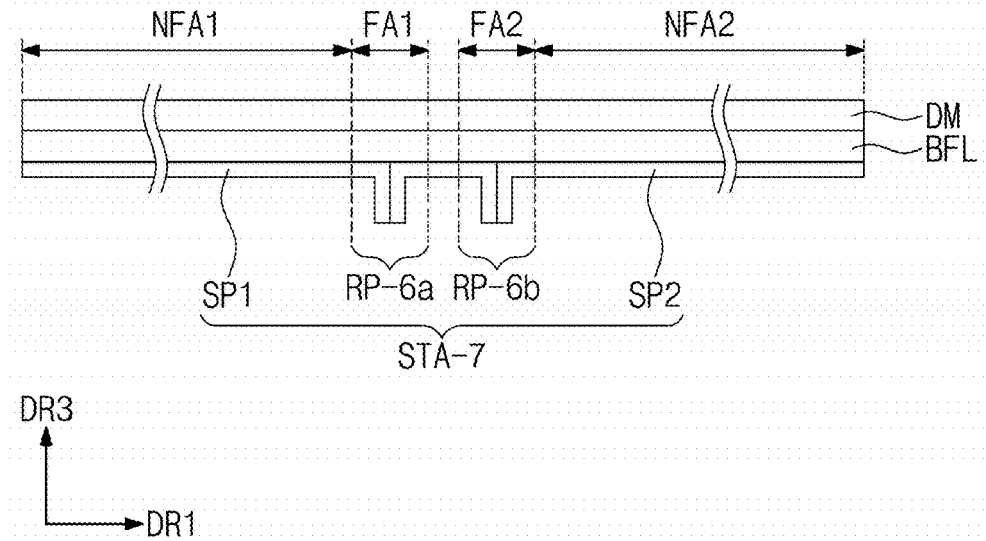
FIG. 14 is a cross-sectional view illustrating an exemplary embodiment of a portion of the constituents of the display device according to the invention.

FIG. 14 is a cross-sectional view illustrating an exemplary embodiment of a portion of the constituents of the display device according to the invention.

Referring to FIG. 14, a sheet member STA-7 may include a first support portion SP1, a second support portion SP2, and a plurality of restoration portions RP-6a and RP-6b.

The plurality of restoration portions RP-6a and RP-6b may be connected between the first support portion SP1 and the second support portion SP2.

A first non-folding area NFA1, a folding area FA1, a second folding area FA2, and a second non-folding area NFA2 may be sequentially defined on the display module DM in the first direction DR1. One restoration portion RP-6a of the plurality of restoration portions RP-6a and RP-6b may overlap the first folding area FA1, and the other restoration portion RP-6b may overlap the second folding area FA2.

Figure 15:
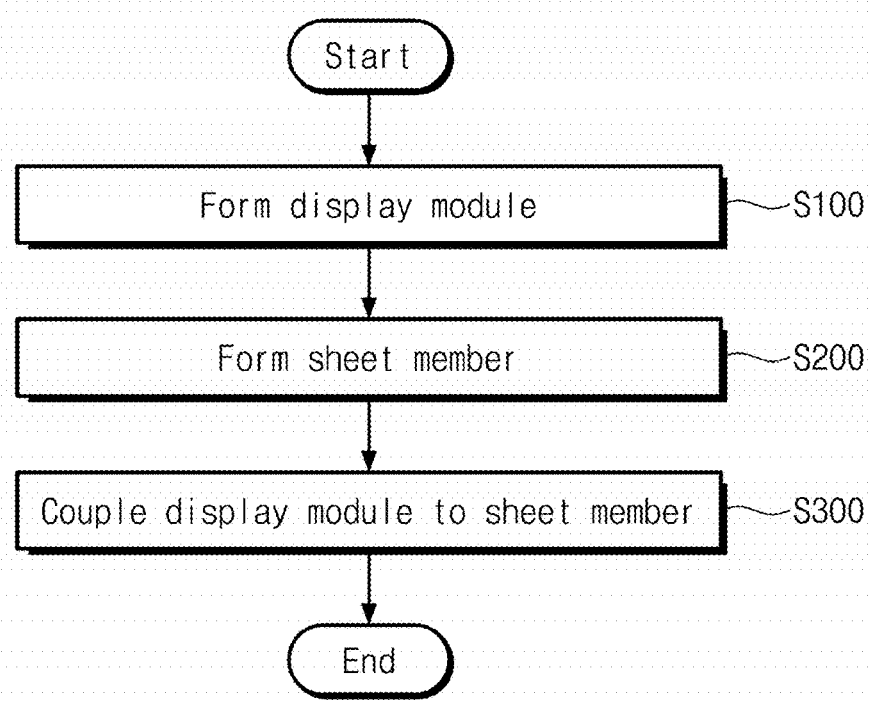
FIG. 15 is a flowchart illustrating an exemplary embodiment of a method for manufacturing a display device according to the invention.

FIG. 15 is a flowchart illustrating an exemplary embodiment of a method for manufacturing a display device according to the invention.

Referring to FIGS. 5A and 15, a display module DM is formed (S100). A first display area DA1 and a second display area DA2 may be defined on the display module DM.

A sheet member STA is provided (S200). The sheet member STA may include at least one or more restoration portions RP. The sheet member STA may have an elastic force by the restoration portions RP in a state in which a first support portion SP1 and a second support portion SP2 are disposed on the same plane.

The display module DM and the sheet member STA are coupled to each other (S300). The display module DM and the sheet member STA may be coupled to each other through an adhesion member. When a lower functional layer BFL is disposed between the display module DM and the sheet member STA, the sheet member STA may be attached to the lower functional layer BFL.

FIGS. 16A to 16F are cross-sectional views illustrating an exemplary embodiment of a method for manufacturing a display device according to the invention.

Figure 16A:
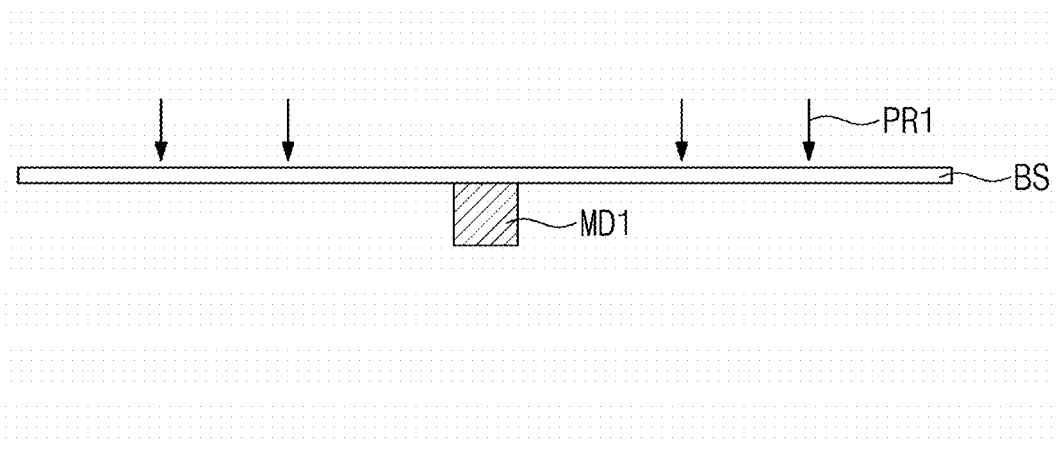
FIGS. 16A to 16F are cross-sectional views illustrating an exemplary embodiment of a method for manufacturing a display device according to the invention.

Referring to FIG. 16A, a base sheet BS is prepared. A first mold MD1 is disposed below the base sheet BS. A first pressure PR1 is applied to the base sheet BS toward the first mold MD1.

Figure 16B:
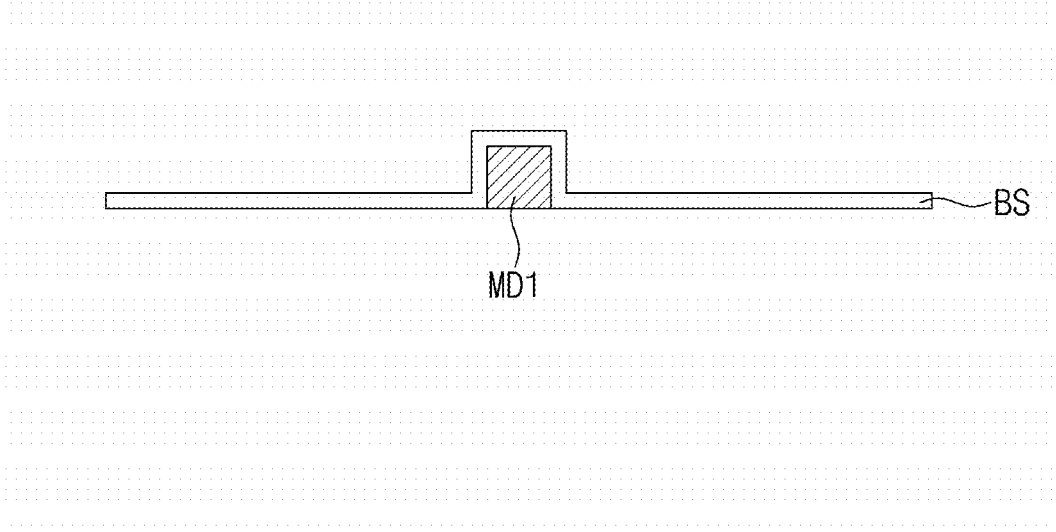

Referring to FIG. 16B, at least a portion of the base sheet BS may be bent in a shape corresponding to the first mold MD1.

Figure 16C:
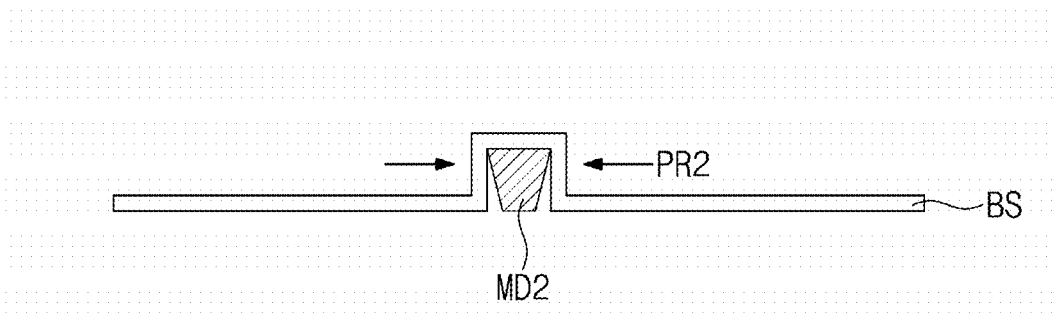

Referring to FIG. 16C, a second mold MD2 is disposed below the base sheet BS. The second mold MD2 may have a shape different from that of the first mold MD1. A second pressure PR2 is applied to the base sheet BS toward the second mold MD2.

Figure 16D:
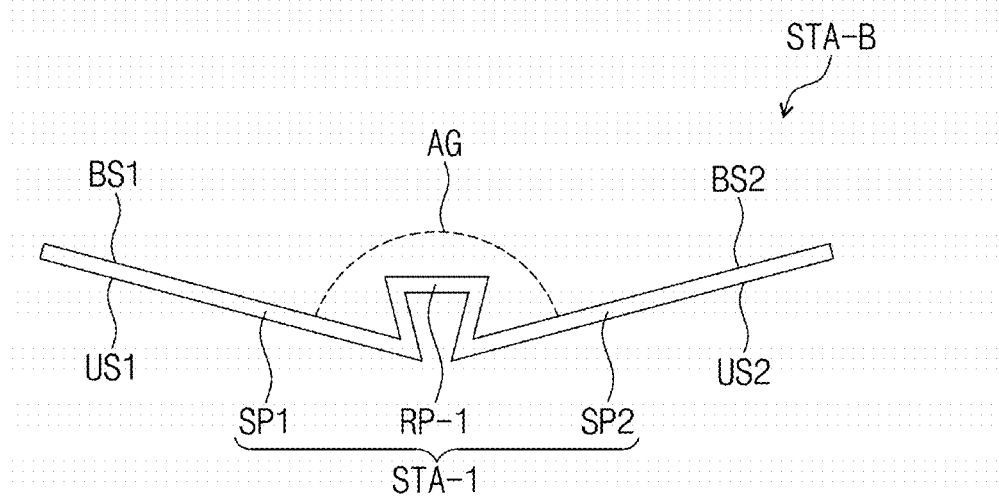

Referring to FIG. 16D, a sheet member STA-B provided by applying the second pressure PR2 to the base sheet BS is illustrated.

The sheet member STA-B may include a first support portion SP1, a second support portion SP2, and a restoration portion RP-1 connected to the first support portion SP1 and the second support portion SP2. The first support portion SP1 and the second support portion SP2 may be angled therebetween at an angle AG less than about 180 degrees. In an exemplary embodiment, the angle AG may range from about 170 degrees to about 180 degrees, for example. However, the numerical range of the angle AG may be merely an example. In another exemplary embodiment, the angle AG may be less than about 170 degrees, for example.

The first support portion SP1 may include a top surface US1 and a bottom surface BS1. The top surface US1 and the bottom surface BS1 may face each other. The second support portion SP2 may include a top surface US2 and a bottom surface BS2. The top surface US2 and the bottom surface BS2 may face each other. The angle AG may be an angle between the bottom surface BS1 and the bottom surface BS2.

Figure 16E:
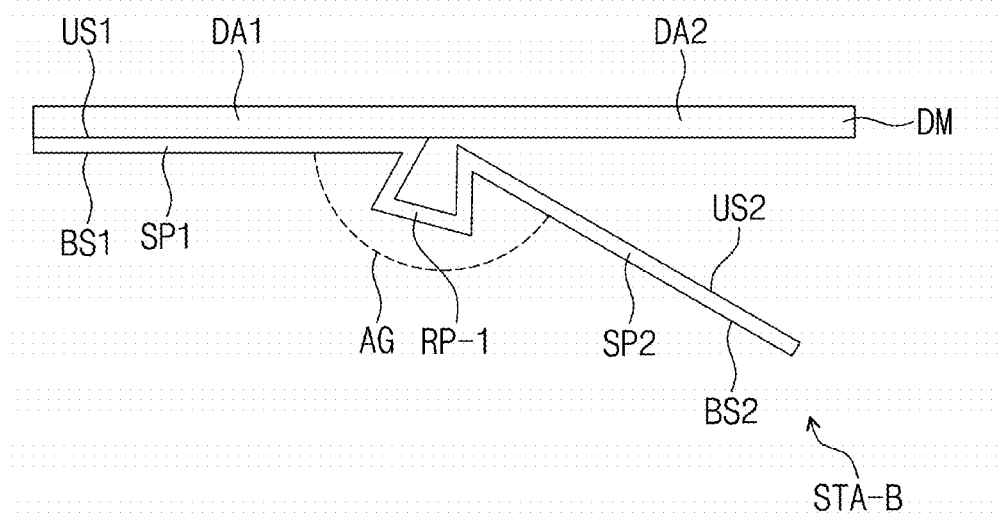

Referring to FIG. 16E, the display module DM and the sheet member STA-B are coupled to each other. In a state in which the top surface US1 is disposed between the display module DM and the bottom surface BS1, and the top surface US2 is disposed between the display module DM and the bottom surface BS2, the sheet member STA-B may be coupled to the display module DM. Although the example in which the sheet member STA-B is coupled to the display module DM is illustrated in FIG. 16E, when the lower functional layer BFL (refer to FIG. 5A) is disposed below the display module DM, the sheet member STA-B may be coupled to the lower functional layer BFL.

Figure 16F:
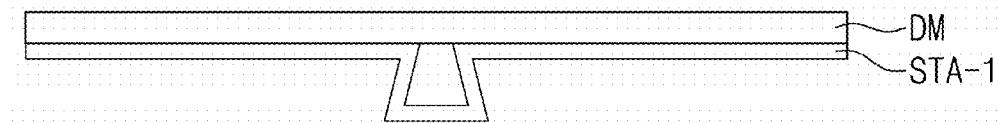

Referring to FIG. 16F, the state in which the display module DM and the sheet member STA-1 are coupled to each other. The sheet member STA-B may be coupled to the display module DM and thus be deformed into a flat state. The sheet member STA-B coupled to the display module DM may be referred to as a sheet member STA-1. The sheet member STA-1 may have an elastic force to return to the shape of the sheet member STA-B. That is, the sheet member STA-1 may relieve stress concentrated into a specific area of the display module DM.

Figure 17A:
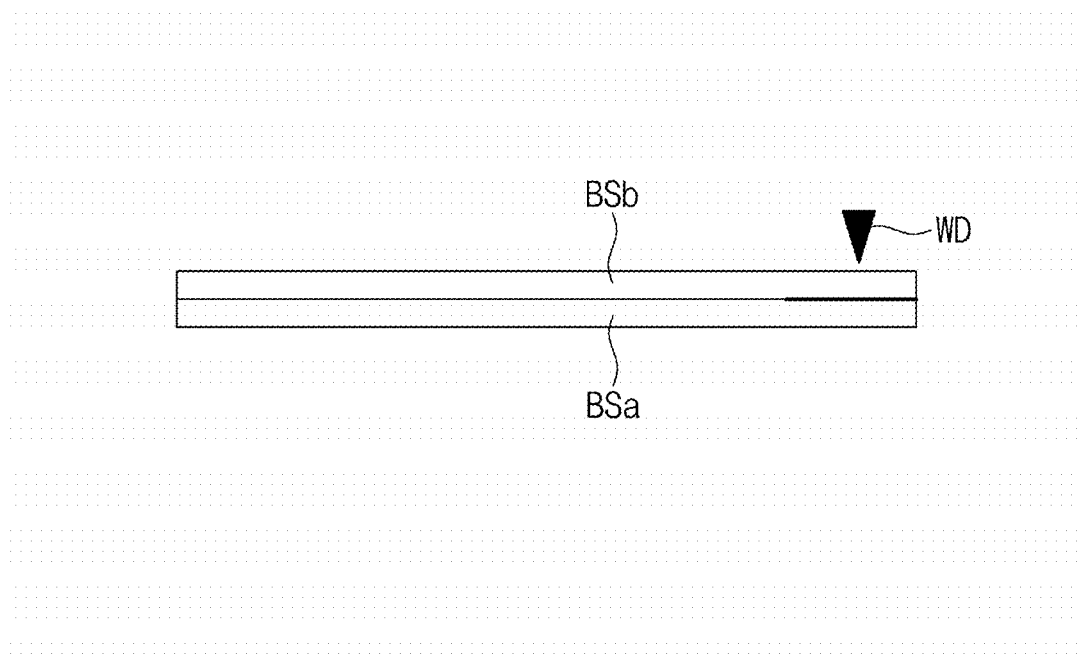
FIGS. 17A and 17B are cross-sectional views illustrating an exemplary embodiment of a method of manufacturing a display device according to the invention.
Figure 17B:
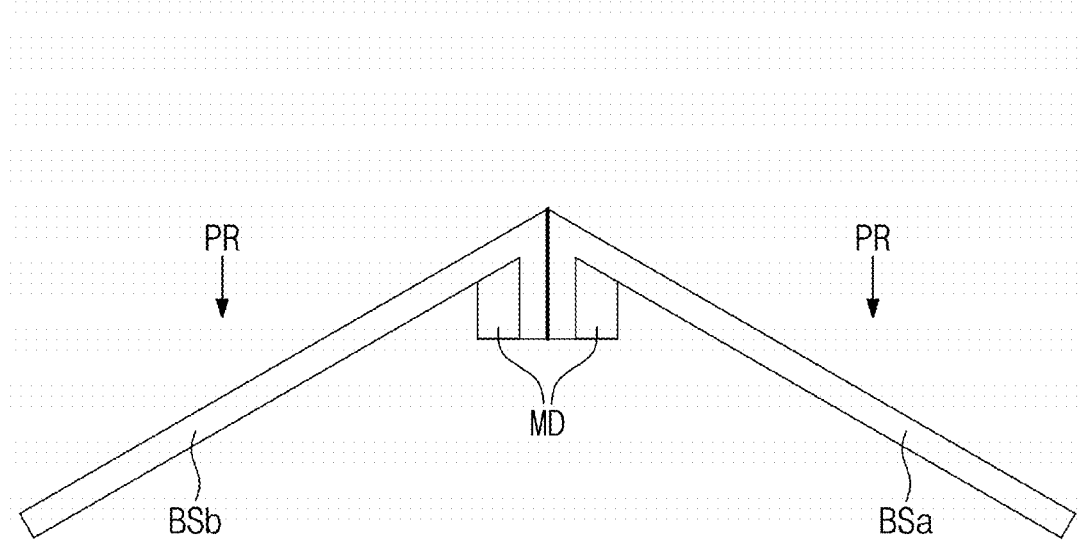

FIGS. 17A and 17B are cross-sectional views illustrating an exemplary embodiment of a method of manufacturing a display device according to the invention.

Referring to FIG. 17A, a first base sheet BSa and a second base sheet BSb are prepared. A portion of an area of the first base sheet BSa and a portion of an area of the second base sheet BSb are coupled to each other. In FIG. 17A, the coupled area may be shown darker than the other uncoupled area. The first base sheet BSa and the second base sheet BSb may be spot welded by a welding device WD.

Referring to FIG. 17B, molds MD spaced apart from each other by the first base sheet BSa and the second base sheet BSb, which are coupled to each other, are disposed.

A pressure PR may be applied to the first base sheet BSa and the second base sheet BSb to bend the first base sheet BSa and the second base sheet BSb.

Referring to FIGS. 11 and 17B, the bent first and second base sheets BSa and BSb may be coupled to the display module DM. A portion of the first base sheet BSa may constitute the first support portion SP1, and the other portion of the first base sheet BSa may constitute the first restoration portion RP1. A portion of the second base sheet BSb may constitute the second support portion SP2, and the other portion of the base sheet BSb may constitute the second restoration portion RP2.

Thereafter, a first elastic member EM1 may be attached between the first support portion SP1 and the first restoration portion RP1, and a second elastic member EM2 may be attached between the second support portion SP2 and the second restoration portion RP2.

Figure 18A:
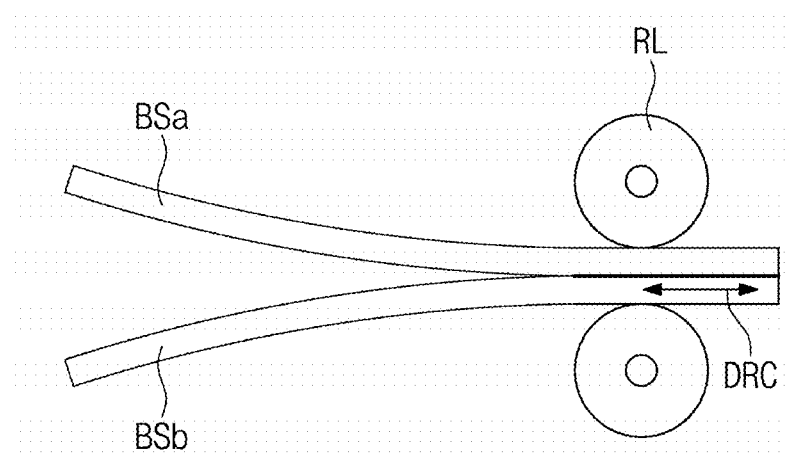
FIGS. 18A and 18B are cross-sectional views illustrating an exemplary embodiment of a method of manufacturing a display device according to the invention.
Figure 18B:
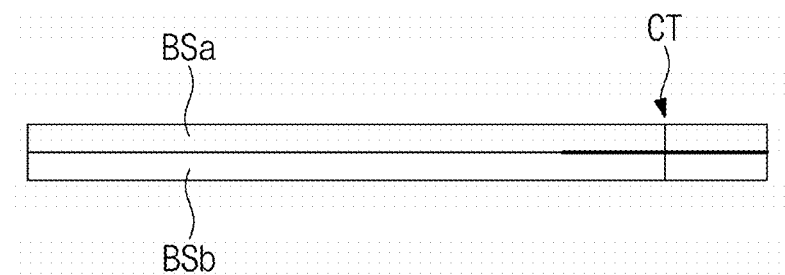

FIGS. 18A and 18B are cross-sectional views illustrating an exemplary embodiment of a method of manufacturing a display device according to the invention.

Referring to FIG. 18A, the first base sheet BSa and the second base sheet BSb are disposed between rollers RL. The first base sheet BSa and the second base sheet BSb may reciprocate to be pressed in a first reciprocating direction DRC by the rollers RL.

Heat may be applied to the rollers RL. In this case, the rollers RL may apply heat and a pressure to the first base sheet BSa and the second base sheet BSb. In an exemplary embodiment of the invention, an environment in which the first base sheet BSa and the second base sheet BSb are pressed by the rollers RL may have a predetermined temperature range. In this case, the first base sheet BSa and the second base sheet BSb may be coupled to each other under the environment having the predetermined temperature range. The process of applying the heat and the pressure to the first base sheet BSa and the second base sheet BSb may be referred to as a hot rolling process.

A cold rolling process may be further performed while the first base sheet BSa and the second base sheet BSb are coupled to each other. The cold rolling process may be a process of applying a pressure to the first base sheet BSa and the second base sheet BSb at room temperature.

Referring to FIG. 18B, at least a portion of the first base sheet BSa and the second base sheet BSb, which are coupled to each other, may be cut along a cut line CT. Thereafter, the process illustrated in FIG. 17B may be performed.

Figure 19A:
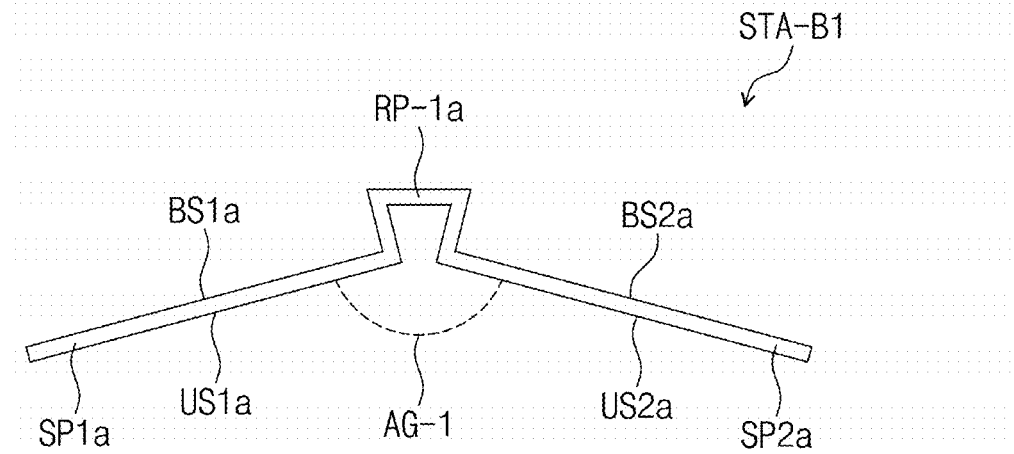
FIGS. 19A, 19B, and 19C are cross-sectional views illustrating an exemplary embodiment of a method of manufacturing a display device according to the invention.
Figure 19B:
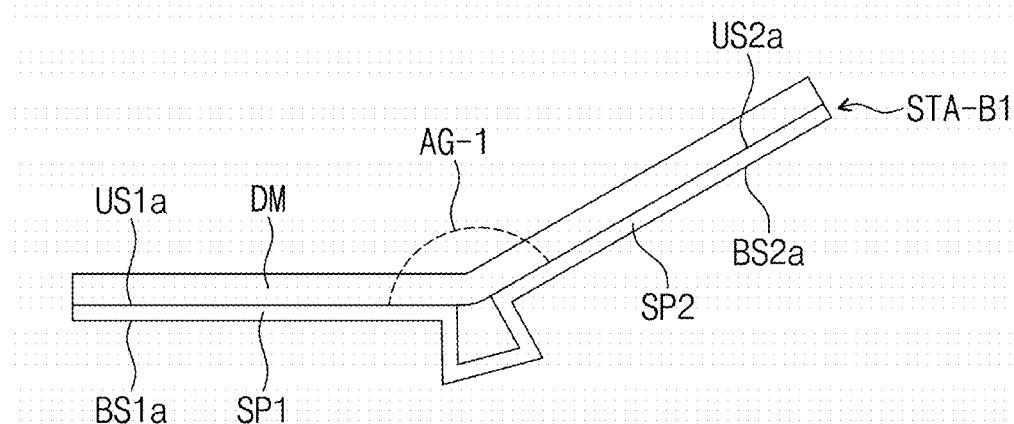
Figure 19C:
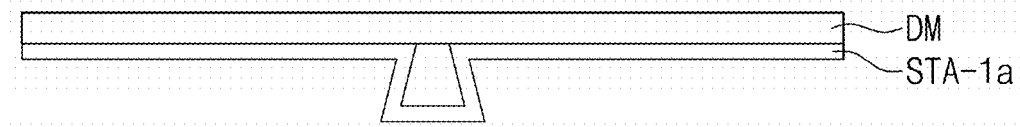

FIGS. 19A, 19B, and 19C are cross-sectional views illustrating an exemplary embodiment of a method of manufacturing a display device according to the invention.

Referring to FIG. 19A, a sheet member STA-B1 may include a first support portion SP1a, a second support portion SP2a, and a restoration portion RP-1a connected to the first support portion SP1a and the second support portion SP2a. The first support portion SP1a and the second support portion SP2a may be angled therebetween at an angle AG-1 less than about 180 degrees. In an exemplary embodiment, the angle AG-1 may range from about 170 degrees to about 180 degrees, for example. However, the numerical range of the angle AG-1 may be merely an example. In another exemplary embodiment, the angle AG-1 may be less than about 170 degrees, for example.

The first support portion SP1a may include a top surface US1a and a bottom surface BS1a. The top surface US1a and the bottom surface BS1a may face each other. The second support portion SP2a may include a top surface US2a and a bottom surface BS2a. The top surface US2a and the bottom surface BS2a may face each other. The angle AG-1 may be defined between the top surface US1a and the top surface US2a.

Referring to FIG. 19B, the moment at which the display module DM and the sheet member STA-B1 are coupled to each other is illustrated. In a state in which the top surface US1a is disposed between the display module DM and the bottom surface BS1a, and the top surface US2a is disposed between the display module DM and the bottom surface BS2a, the sheet member STA-B1 may be coupled to the display module DM.

Referring to FIG. 19C, the state in which the display module DM and the sheet member STA-1a are coupled to each other. The sheet member STA-B1 (refer to FIG. 19B) may be coupled to the display module DM and thus be deformed into a flat state. The sheet member STA-B1 coupled to the display module DM may be referred to as a sheet member STA-1a. The sheet member STA-1a may have an elastic force to return to the shape of the sheet member STA-B1. That is, the sheet member STA-1a may relieve stress concentrated into a specific area of the display module DM.

When the display device is repeatedly folded, the stress exceeding the yield strength may be applied to the display module. Thus, the shape of the display module may be permanently deformed to deteriorate the folding reliability. Particularly, the possibility of the permanent deformation may be high in the folding area. According to the invention, the stress may be prevented from being concentrated to a specific area of the display module by the sheet member. Therefore, the permanent deformation of the display module may be prevented to improve the folding reliability of the display device.

It will be apparent to those skilled in the art that various modifications and variations may be made in the invention. Thus, it is intended that the invention covers the modifications and variations of this invention provided they come within the scope of the appended claims and their equivalents. Hence, the real protective scope of the invention shall be determined by the technical scope of the accompanying claims.

What is claimed is:

1. A display device comprising:
a display module on which a first non-folding area, a folding area, and a second non-folding area are sequentially defined in a first direction and which is deformable between a first state which is an unfolded sate and a second state which is a folded state; and
a sheet member comprising a first support portion overlapping the first non-folding area, a second support portion overlapping the second non-folding area, and a restoration portion overlapping the folding area, which are disposed below the display module,
wherein, when the display module is in the first state, the restoration portion has an elastic force in a direction opposite to a folding direction,
wherein the first support portion and the second support portion are flat and coplanar in the first state, and
wherein the restoration portion includes a pair of acute angle bends each connected to a respective one of the first and second support portions.

2. The display device of claim 1, wherein the restoration portion is connected between the first support portion and the second support portion, and
a first area of the restoration portion, which is adjacent to the first support portion, and a second area of the restoration portion, which is adjacent to the second support portion, are bent.

3. The display device of claim 2, wherein an area between the first area and the second area of the restoration portion has a curvature.

4. The display device of claim 2, wherein the restoration portion comprises a bent area defined between the first area and the second area, and the bent area is an area on which the restoration portion is bent.

5. The display device of claim 2, wherein the restoration portion protrudes from the first support portion and the second support portion in a direction which is away from the display module.

6. The display device of claim 2, wherein the restoration portion protrudes from the first support portion and the second support portion toward the display module.

7. The display device of claim 2, wherein the first support portion, the restoration portion, and the second support portion are unitary with each other.

8. The display device of claim 2, wherein the restoration portion comprises a first restoration portion connected to the first support portion and bent from the first support portion and a second restoration portion connected to the second support portion and bent from the second support portion, and the first restoration portion and the second restoration portion are coupled to each other.

9. The display device of claim 2, wherein the sheet member further comprises:

a first elastic member attached to the first area; and a second elastic member attached to the second area.

10. The display device of claim 1, wherein the restoration portion is provided in plural, and the plurality of restoration portions is connected between the first support portion and the second support portion.

11. The display device of claim 1, wherein each of the first support portion and the second support portion extend toward an area overlapping the folding area so as to be unitary with each other, and the restoration portion is attached to a rear surface of the first support portion overlapping the folding area and a rear surface of the second support portion overlapping the folding area.

12. The display device of claim 1, wherein each of the first support portion, the second support portion, and the restoration portion comprises invar, stainless steel, an amorphous metal, a copper alloy, or a clad metal.

13. The display device of claim 1, wherein, when changed from the first state into the second state, the second non-folding area rotates in a first rotation direction with respect to the first non-folding area, and a direction of the elastic force is opposite to the first rotation direction.

14. The display device of claim 1, further comprising a step compensation layer disposed between the display module and the sheet member, wherein the step compensation layer overlaps the first non-folding area, the folding area, and the second non-folding area.

15. The display device of claim 14, wherein the step compensation layer comprises a resin or a metal.

16. The display device of claim 1, wherein the restoration portion is disposed only in the folding area connected to the first and second support portions.

* * * * *